US010388816B2

(12) United States Patent
Rae

(10) Patent No.: US 10,388,816 B2
(45) Date of Patent: Aug. 20, 2019

(54) DEEP TRENCH ISOLATION (DTI) BOUNDED SINGLE PHOTON AVALANCHE DIODE (SPAD) ON A SILICON ON INSULATOR (SOI) SUBSTRATE

(71) Applicant: STMicroelectronics (Research & Development) Limited, Marlow, Buckinghamshire (GB)

(72) Inventor: Bruce Rae, Edinburgh (GB)

(73) Assignee: STMicroelectronics (Research & Development) Limited, Marlow (GB)

( * ) Notice: Subject to any disclaimer, the term of this patent is extended or adjusted under 35 U.S.C. 154(b) by 88 days.

(21) Appl. No.: 15/712,673

(22) Filed: Sep. 22, 2017

(65) Prior Publication Data

US 2019/0097075 A1 Mar. 28, 2019

(51) Int. Cl.

*H01L 31/10* (2006.01)
*H01L 31/107* (2006.01)
*H01L 31/02* (2006.01)
*H01L 27/144* (2006.01)

(52) U.S. Cl.

CPC ...... *H01L 31/1075* (2013.01); *H01L 27/1443* (2013.01); *H01L 31/02027* (2013.01)

(58) Field of Classification Search

CPC ........... H01L 31/1075; H01L 31/02027; H01L 27/1443

See application file for complete search history.

(56) References Cited

U.S. PATENT DOCUMENTS

| | | | |
|---|---|---|---|
| 9,450,007 B1 * | 9/2016 | Motta | H01L 27/14629 |
| 9,683,890 B2 * | 6/2017 | Skorka | G01J 1/44 |
| 9,780,248 B2 * | 10/2017 | Huang | H01L 31/1075 |
| 2013/0193546 A1 | 8/2013 | Webster et al. | |
| 2014/0191115 A1 | 7/2014 | Webster et al. | |
| 2014/0291481 A1 | 10/2014 | Zhang et al. | |

* cited by examiner

*Primary Examiner* — Tony Ko

(74) *Attorney, Agent, or Firm* — Crowe & Dunlevy

(57) ABSTRACT

A semiconductor on insulator substrate includes a semiconductor support layer, a buried insulating layer over the semiconductor support layer and an epitaxial semiconductor layer over the buried insulating layer. A deep trench isolation penetrates completely through the epitaxial semiconductor layer to the buried insulating layer to electrically insulate a first region of the epitaxial semiconductor layer from a second region of the epitaxial semiconductor layer. A single photon avalanche diode (SPAD) includes an anode formed by the first region of the epitaxial semiconductor layer and a cathode formed by a well located within the first region of the epitaxial semiconductor layer. An ancillary circuit for the SPAD is located in the second region of the epitaxial semiconductor layer and electrically coupled to the SPAD.

20 Claims, 2 Drawing Sheets

362
300
340
360
350
anode
cathode
336
316
318
364
Ancillary Circuit
330
312
346
322
320
350
308
306
302
304

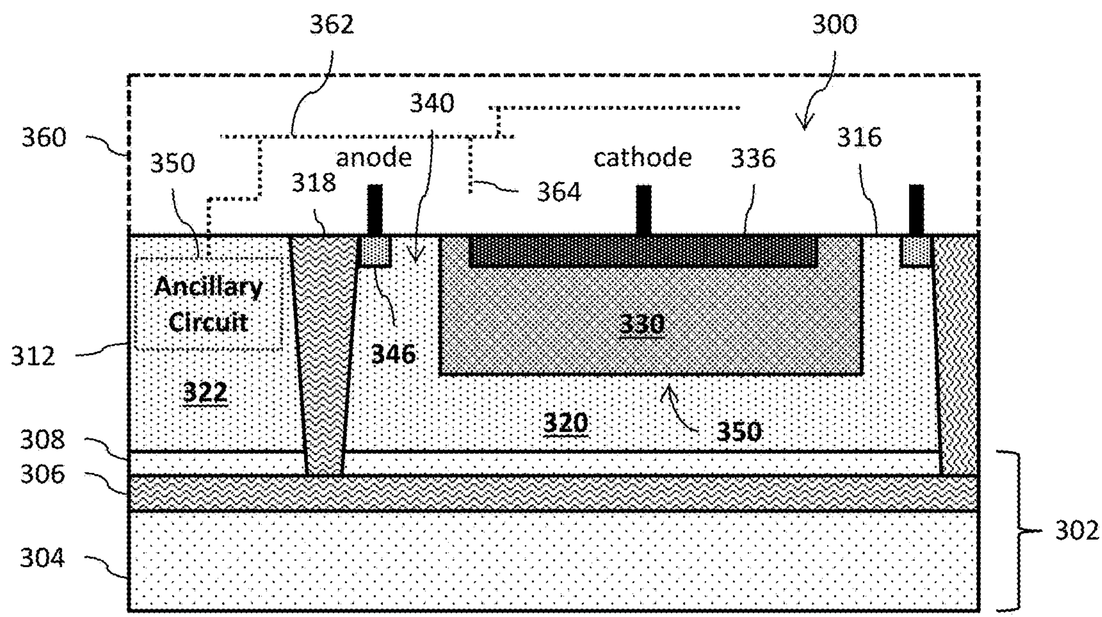
FIG. 3
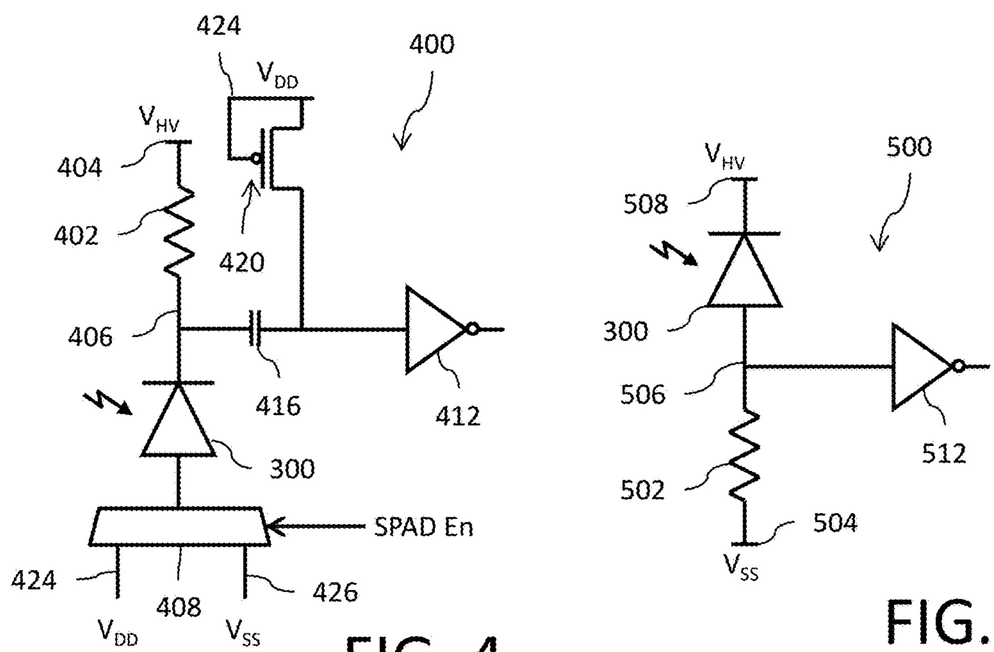
FIG. 4
FIG. 5

DEEP TRENCH ISOLATION (DTI) BOUNDED SINGLE PHOTON AVALANCHE DIODE (SPAD) ON A SILICON ON INSULATOR (SOI) SUBSTRATE

TECHNICAL FIELD

The present invention relates to a substrate isolated single photon avalanche diode (SPAD) and circuits using such a SPAD.

BACKGROUND

Reference is made to FIG. 1 showing a prior art single photon avalanche diode (SPAD) 100 (see, also, United States Patent Application Publication No. 2013/0193546, incorporated by reference). The SPAD 100 is formed in an epitaxial semiconductor layer 102 grown on a semiconductor substrate 104. The layer 102 and substrate 104 may, for example, be doped with a p-type dopant. The p-type dopant exhibits a dopant concentration gradient such that the epitaxial semiconductor layer 102 is more heavily doped towards and closer to the semiconductor substrate 104 and more lightly doped towards and closer to a top surface 106. A deep well 110 is implanted in the epitaxial semiconductor layer 102 and is covered with a shallow well 112. The wells 110 and 112 are doped, for example, with an n-type dopant. The well 112 includes an implant of a heavily doped electrode 116 forming the cathode terminal of the SPAD 100. The electrode 116 is doped, for example, with an n-type dopant. A region 120 of the epitaxial semiconductor layer 102 forms a guard ring surrounding the wells 110 and 112. A well 124 is implanted in the epitaxial semiconductor layer 102 surrounding the guard ring region 120. The well 124 is doped, for example, with a p-type dopant. The well 124 includes an implant of a heavily doped electrode 126 forming the anode terminal of the SPAD 100. The electrode 126 is doped, for example, with a p-type dopant. A shallow trench isolation (STI) structure 128 is provided in the well 124. The SPAD 100 includes a multiplication junction 130, where avalanche breakdown occurs during use, that is located at the PN junction between the p-type doped epitaxial semiconductor layer 102 and the n-type doped deep well 110.

FIG. 2 is a schematic diagram of a read out circuit 200 for the SPAD 100 of FIG. 1. The circuit 200 includes a quench resistor 202 coupled in series with the SPAD 100. More specifically, one terminal of the resistor 202 is coupled to a high supply voltage node 204 and the other terminal of the resistor 202 is coupled at node 206 to the cathode terminal of the SPAD 100. The anode terminal of the SPAD is coupled to a ground reference voltage node 208. The high positive breakdown voltage $V_{BD}$ at the high supply voltage node 204 is not compatible with standard CMOS transistor gates. Thus, the node 206 cannot be directly connected to the input of the CMOS inverter circuit 212. An AC coupling capacitor 216 is provided with one capacitor plate coupled to node 206 and the other capacitor plate coupled to the CMOS inverter circuit 212 input. A bias transistor 220 is coupled between a bias supply voltage ($V_{DD}$) node 224 and the input of the CMOS inverter circuit 212. The bias transistor 220 may, for example, comprise a p-channel MOSFET with gate and source terminals coupled to the bias supply voltage node 224 and a drain terminal coupled to the CMOS inverter circuit 212 input.

With the SPAD 100 of FIG. 1 in the circuit 200 of FIG. 2 it will be noted that the anode terminal of the SPAD 100 is formed by the integrated circuit chip substrate layers 102 and 104 which is grounded 208. In this configuration, the SPAD 100 cannot be turned off and accordingly presents a load to the high positive breakdown voltage $V_{BD}$ at the high supply voltage node 204.

SUMMARY

In an embodiment, a circuit comprises: a semiconductor on insulator substrate including a semiconductor support layer, a buried insulating layer over the semiconductor support layer and an epitaxial semiconductor layer over the buried insulating layer, wherein the epitaxial semiconductor layer is doped with a first dopant conductivity type; a deep trench isolation penetrating completely through the epitaxial semiconductor layer to the buried insulating layer, said deep trench isolation electrically insulating a first region of the epitaxial semiconductor layer from a second region of the epitaxial semiconductor layer; a single photon avalanche diode (SPAD) comprising an anode formed by the first region of the epitaxial semiconductor layer and a cathode formed by a well located within the first region of the epitaxial semiconductor layer, said well doped with a second dopant conductivity type opposite the first dopant conductivity type; and an ancillary circuit for said SPAD located in the second region of the epitaxial semiconductor layer and electrically coupled to said SPAD.

In an embodiment, a single photon avalanche diode (SPAD) comprises: a semiconductor on insulator substrate including a semiconductor support layer, a buried insulating layer over the semiconductor support layer and an epitaxial semiconductor layer over the buried insulating layer, wherein the epitaxial semiconductor layer is doped with a first dopant conductivity type; a deep trench isolation penetrating completely through the epitaxial semiconductor layer to the buried insulating layer, said deep trench isolation electrically insulating a first region of the epitaxial semiconductor layer from a second region of the epitaxial semiconductor layer, said first region forming an anode of the SPAD; and a well located within the first region of the epitaxial semiconductor layer, said well doped with a second dopant conductivity type opposite the first dopant conductivity type, said well forming a cathode of the SPAD.

BRIEF DESCRIPTION OF THE DRAWINGS

The accompanying drawings are included to provide a further understanding of the invention and are incorporated in and constitute a part of this specification, illustrate embodiments of the invention and together with the description serve to explain the principles of the invention.

In the drawings:

FIG. 3 is a schematic cross-sectional diagram of a SPAD;

FIG. 4 is a circuit diagram of a control and read out circuit for the SPAD of FIG. 3; and FIG. 5 is a circuit diagram of a read out circuit for the SPAD of FIG. 3.

DETAILED DESCRIPTION

Figure 1:
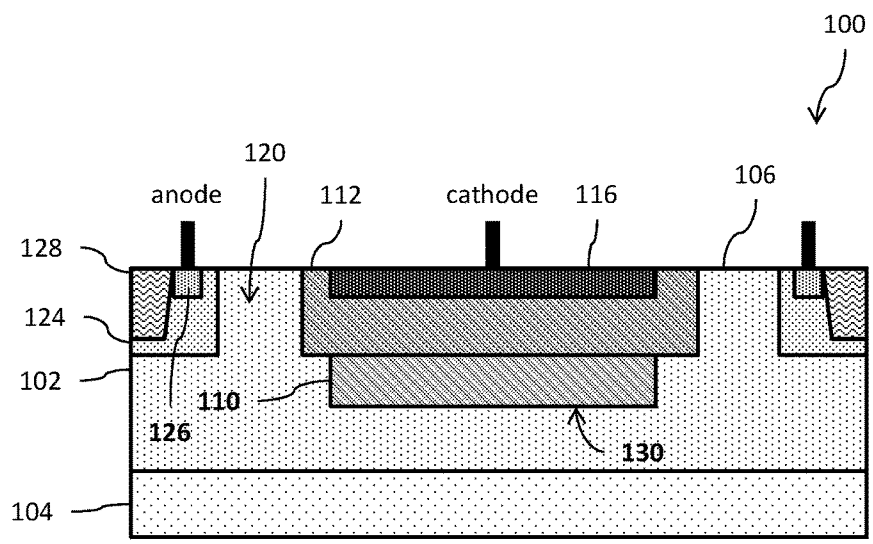
FIG. 1 is a schematic cross-sectional diagram of a prior art single photon avalanche diode (SPAD)
Figure 2:
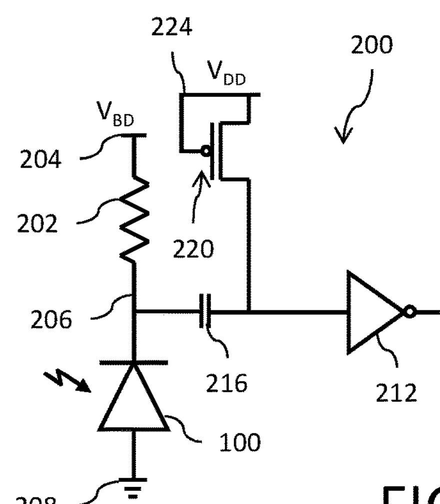
FIG. 2 is a circuit diagram of a prior art read out circuit for the SPAD of FIG. 1.

Reference is made to FIG. 3 showing a single photon avalanche diode (SPAD) 300. The SPAD 300 is supported by a silicon on insulator (SOI) substrate 302 comprising a semiconductor support layer 304, a buried oxide (BOX) layer 306 and a semiconductor film layer 308. The SPAD 300 is formed in an epitaxial semiconductor layer 312 grown on the semiconductor film layer 308 of the SOI substrate 302. The layers 308 and 312 may, for example, be doped with a p-type dopant. The p-type dopant exhibits a dopant concentration gradient such that the epitaxial semiconductor layer 312 is more heavily doped towards and closer to the semiconductor film layer 308 and more lightly doped towards and closer to a top surface 316.

Deep trench isolation structures 318 delimit a SPAD region 320 of the layers 308 and 312 which support the SPAD 300 and, with the assistance of the BOX layer 306, electrically insulate (isolate) that region 320 from other regions 322 of the layers 308 and 312. The deep trench isolation structures 318 extend completely through the layers 308 and 312 from the top surface 316 to contact the BOX layer 306.

A deep well 330 is implanted in the epitaxial semiconductor layer 312. The well 330 is doped, for example, with an n-type dopant. The well 330 includes an implant of a heavily doped electrode 336 forming the cathode terminal of the SPAD 300. The electrode 336 is doped, for example, with an n-type dopant. A region 340 of the epitaxial semiconductor layer 312 forms a guard ring surrounding the well 330, with the deep trench isolation structures 318 surrounding the region 340 in delimiting the isolated SPAD region 320. The guard ring region 340 includes an implant of a heavily doped electrode 346 forming the anode terminal of the SPAD 300. The electrode 346 is doped, for example, with a p-type dopant. The SPAD 300 includes a multiplication junction 350, where avalanche breakdown occurs during use, that is located at the PN junction between the p-type doped epitaxial semiconductor layer 312 and the n-type doped deep well 330. In this configuration, the PN junction may be driven deep into the substrate to enhance sensitivity to infra-red radiation.

It will be understood that the deep well 330 may be implemented in a manner similar to the wells 110 and 112 of FIG. 1 in certain embodiments.

FIG. 4 is a circuit diagram of a control and read out circuit 400 for the SPAD 300 of FIG. 3. The circuit 400 includes a quench resistor 402 coupled in series with the SPAD 300. More specifically, one terminal of the resistor 402 is coupled to a high supply voltage ($V_{HV}$) node 404 and the other terminal of the resistor 402 is coupled at node 406 to the cathode terminal of the SPAD 300. The anode terminal of the SPAD 300 is coupled to an output of a multiplexer circuit 408. The multiplexer circuit 408 has a first input coupled to a first bias supply voltage ($V_{DD}$) node 424 and a second input coupled to a second bias supply voltage ($V_{SS}$) node 426. The switching operation of the multiplexer circuit 408 is controlled by a SPAD enable signal (SPAD En): when SPAD En is in a first logic state the first bias supply voltage $V_{DD}$ is applied to the anode terminal of the SPAD 300; and when SPAD En is in a second logic state the second bias supply voltage $V_{SS}$ is applied to the anode terminal of the SPAD 300. By controlling the bias voltage at the anode terminal of the SPAD 300, the on/off state of the SPAD 300 is selectable. For example, with SPAD En in the second logic state and the multiplexer circuit 408 operating to apply the second bias supply voltage $V_{SS}$ to the anode terminal of the SPAD 300, a sufficient reverse bias across the SPAD 300 is available to configure the SPAD 300 for operation in Geiger mode. Conversely, with SPAD En in the first logic state and the multiplexer circuit 408 operating to apply the first bias supply voltage $V_{DD}$ to the anode terminal of the SPAD 300, there is a reduction of the reverse bias across the SPAD 300 sufficient to bring the SPAD 300 below the reverse bias breakdown voltage and drop out of Geiger mode (i.e., $V_{HV}-V_{SS}<V_{BD}$). In the latter configuration responsive to the first logic state of the SPAD En signal, the SPAD 300 is no longer single photon sensitive and does not operate to draw significant current from the high supply voltage node 404.

The high supply voltage $V_{HV}$ at the high supply voltage node 404 may not be compatible with standard CMOS transistor gates. Thus, the node 406 cannot be directly connected to the input of the CMOS inverter circuit 412. An AC coupling capacitor 416 is provided with one capacitor plate coupled to node 406 and the other capacitor plate coupled to the CMOS inverter circuit 412 input. A bias transistor 420 is coupled between the first bias supply voltage ($V_{DD}$) node 424 and the input of the CMOS inverter circuit 412. The bias transistor 420 may, for example, comprise a p-channel MOSFET with gate and source terminals coupled to the first bias supply voltage node 424 and a drain terminal coupled to the CMOS inverter circuit 412 input.

FIG. 5 is a circuit diagram of a read out circuit 500 for the SPAD 300 of FIG. 3. The circuit 500 includes a quench resistor 502 coupled in series with the SPAD 300. More specifically, one terminal of the resistor 502 is coupled to a low supply voltage ($V_{SS}$) node 504 and the other terminal of the resistor 502 is coupled at node 506 to the anode terminal of the SPAD 300. The cathode terminal of the SPAD 300 is coupled to a high supply voltage ($V_{HV}$) node 508. The difference between the VHV and VSS voltages is sufficient to bias the SPAD 300 above the reverse breakdown voltage and place the SPAD 300 in Geiger mode (i.e., $V_{HV}-V_{SS}>V_{BD}$). However, the difference between the VHV and VSS voltages does not exceed the safe operating gate voltage of standard CMOS transistor gates. Thus, the node 506 can be directly connected to the input of the CMOS inverter circuit 512.

FIG. 5 details a passive quench SPAD pixel. The SPAD is reverse biased beyond its breakdown voltage via $V_{HV}$. Upon breakdown (due to a photon strike or dark count), a large current flows in the diode, rapidly charging the parasitic capacitance of node 506. This causes the SPAD anode voltage to rise rapidly, reducing the reverse bias voltage across the SPAD and stopping the current flow. The capacitor then discharges through resistor 502, causing the anode voltage to fall, increasing the reverse bias across the SPAD, bringing it back beyond the reverse bias breakdown voltage and into Geiger mode. The circuit is then ready to detect the next breakdown event. This process creates a voltage pulse on 506 that can be processed by the output inverter 512.

Reference is now once again made to FIG. 3. With respect to the circuit 400 of FIG. 4, the circuit components 402, 408, 412 and 420 (referred to as an ancillary circuit 350) may be fabricated on or in the regions 322 isolated from the SPAD region 320. Likewise, with respect to the circuit 500 of FIG. 5, the circuit components 502 and 512 (referred to as an ancillary circuit 350) may be fabricated on or in the regions 322 isolated from the SPAD region 320. An interconnect layer 360 over the substrate is provided for electrically coupling on or the other or both the anode and/or cathode of the SPAD 300 to the ancillary circuit 350. As known to those skilled in the art, the interconnect layer may be formed by a pre-metallization dielectric layer include contacts as well as one or more metallization layers including metal lines 362 and vias 364 for routing electrical couplings and connections.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

The invention claimed is:

1. A circuit, comprising:

a semiconductor on insulator substrate including a semiconductor support layer, a buried insulating layer over the semiconductor support layer and an epitaxial semiconductor layer over the buried insulating layer, wherein the epitaxial semiconductor layer is doped with a first dopant conductivity type;

a deep trench isolation penetrating completely through the epitaxial semiconductor layer to the buried insulating layer, said deep trench isolation electrically insulating a first region of the epitaxial semiconductor layer from a second region of the epitaxial semiconductor layer;

a single photon avalanche diode (SPAD) comprising an anode formed by the first region of the epitaxial semiconductor layer and a cathode formed by a well located within the first region of the epitaxial semiconductor layer, said well doped with a second dopant conductivity type opposite the first dopant conductivity type; and an ancillary circuit for said SPAD located in the second region of the epitaxial semiconductor layer and electrically coupled to said SPAD.

2. The circuit of claim 1, wherein the ancillary circuit comprises a multiplexer circuit having an output coupled to the anode.

3. The circuit of claim 2, wherein the multiplexer has a first input configured to receive a first bias supply voltage sufficient to configure the SPAD in Geiger mode, a second input configured to receive a second bias supply voltage sufficient to configure the SPAD to drop out of Geiger mode, and a control input that receives a SPAD enable signal for selecting between the first and second bias supply voltages for application to the anode.

4. The circuit of claim 2, wherein the ancillary circuit further comprises a resistor having a terminal coupled to the cathode.

5. The circuit of claim 4, wherein another terminal of the resistor is coupled to receive a high bias voltage.

6. The circuit of claim 4, wherein the ancillary circuit further comprises a CMOS inverter circuit having an input coupled to the cathode.

7. The circuit of claim 6, wherein the input of the CMOS inverter is coupled to the cathode through a capacitor.

8. The circuit of claim 6, wherein the ancillary circuit further comprises a bias transistor coupled between a supply voltage and the input of the CMOS inverter.

9. The circuit of claim 1, wherein the ancillary circuit comprises a resistor having a terminal coupled to the anode.

10. The circuit of claim 9, wherein the ancillary circuit further comprises a CMOS inverter having an input coupled to the anode.

11. The circuit of claim 10, wherein the input of the CMOS inverter is directly connected to the anode.

12. The circuit of claim 9, wherein another terminal of the resistor is coupled to receive a low bias voltage and the cathode is coupled to receive a high bias voltage, the low and high bias voltages configured to bias the SPAD above a reverse breakdown voltage and place the SPAD in Geiger mode.

13. A single photon avalanche diode (SPAD), comprising:

a semiconductor on insulator substrate including a semiconductor support layer, a buried insulating layer over the semiconductor support layer and an epitaxial semiconductor layer over the buried insulating layer, wherein the epitaxial semiconductor layer is doped with a first dopant conductivity type;

a deep trench isolation penetrating completely through the epitaxial semiconductor layer to the buried insulating layer, said deep trench isolation electrically insulating a first region of the epitaxial semiconductor layer from a second region of the epitaxial semiconductor layer, said first region forming an anode of the SPAD; and a well located within the first region of the epitaxial semiconductor layer, said well doped with a second dopant conductivity type opposite the first dopant conductivity type, said well forming a cathode of the SPAD.

14. The SPAD of claim 13, wherein the second region includes an ancillary circuit for operation of said SPAD that is electrically coupled to said SPAD.

15. The SPAD of claim 14, wherein the ancillary circuit comprises:

a multiplexer circuit having an output coupled to the anode;

a resistor having a terminal coupled to the cathode; and a CMOS inverter circuit having an input coupled to the cathode.

16. The SPAD of claim 15, wherein another terminal of the resistor is coupled to receive a high bias voltage.

17. The SPAD of claim 15, wherein the input of the CMOS inverter is coupled to the cathode through a capacitor and the ancillary circuit further comprises a bias transistor coupled between a supply voltage and the input of the CMOS inverter.

18. The SPAD of claim 15, wherein the multiplexer has a first input configured to receive a first bias supply voltage sufficient to configure the SPAD in Geiger mode, a second input configured to receive a second bias supply voltage sufficient to configure the SPAD to drop out of Geiger mode, and a control input that receives a SPAD enable signal for selecting between the first and second bias supply voltages for application to the anode.

19. The SPAD of claim 14, wherein the ancillary circuit comprises:

a resistor having a terminal coupled to the anode and another terminal coupled to receive a low bias voltage where the cathode is coupled to receive a high bias voltage, the low and high bias voltages sufficient to bias the SPAD above a reverse breakdown voltage which places the SPAD in Geiger mode; and a CMOS inverter having an input coupled to the anode.

20. The SPAD of claim 19, wherein the input of the CMOS inverter is directly connected to the anode.

* * * * *